United States Patent

Tanzawa et al.

Patent Number: 5,905,691
Date of Patent: May 18, 1999

[54] SEMICONDUCTOR MEMORY

[75] Inventors: Toru Tanzawa, Ebina; Ken Takeuchi, Tokyo; Tomoharu Tanaka, Yokohama, all of Japan

[73] Assignee: Kabushiki Kaisha Toshiba, Kawasaki, Japan

[21] Appl. No.: 09/083,949

[22] Filed: May 26, 1998

[51] Int. Cl.[6] .................................................. G11C 8/00
[52] U.S. Cl. ................................. 365/233; 365/230.03
[58] Field of Search .............................. 365/233, 230.03, 365/239, 240

[56] References Cited

U.S. PATENT DOCUMENTS

| 5,575,715 | 11/1996 | Williams et al. | 365/230.03 |
| 5,600,605 | 2/1997 | Schaefer | 365/233 |
| 5,600,606 | 2/1997 | Rao | 365/233 |
| 5,612,926 | 3/1997 | Yazawa et al. | 365/239 |
| 5,673,233 | 9/1997 | Wright et al. | 365/233 |

*Primary Examiner*—Son T. Dinh
*Attorney, Agent, or Firm*—Banner & Witcoff, Ltd.

[57] ABSTRACT

A command register recognizes a batch-write test mode and outputs to a clock generating circuit signals indicating the recognition of the mode. In the batch-write test mode, the clock generating circuit generates a clock signal having a longer cycle than a clock signal generated in a normal operation mode. The clock signal is supplied to a row decoder (word line potential control circuit) to control the operation of the row decoder, so that the row decoder supplies a sufficient write potential to all word lines.

20 Claims, 8 Drawing Sheets

SEMICONDUCTOR MEMORY

BACKGROUND OF THE INVENTION

The present invention relates generally to a semiconductor memory and more particularly to a semiconductor memory for use in a test of a non-volatile semiconductor memory such as a flash EEPROM.

FIG. 8 shows a structure of a conventional non-volatile semiconductor memory.

A memory cell array 11 of the conventional non-volatile semiconductor memory, though not shown in detail in FIG. 8, comprises a plurality of electrically programmable memory cells arranged in a matrix. A row decoder 12 includes a decode circuit for decoding row address signals and a word line potential control circuit for determining word line potentials. The decode circuit selects, on the basis of row address signals, a word line and memory cells connected to the selected word line for which data erase, write or read is executed. The word line potential control circuit supplies a predetermined potential to a control gate of the memory cells.

A clock generating circuit 13 generates a clock signal OSC for driving the row decoder 12. A sense amplifier/bitline potential control circuit 14, for example, senses data or controls bitline potentials in respective modes of erase, write and read-out.

A column decoder 15 turns on a column select transistor 16 existing on a predetermined select column on the basis of a column address signal, and leads data of the predetermined select column to an input/output buffer 17 or leads data from the input/output buffer 17 to the predetermined select column.

In these years, attention has been paid to a NAND type EEPROM as a non-volatile semiconductor memory. A memory cell array of the NAND type EEPROM comprises a plurality of NAND cells. The NAND cells include a plurality of series-connected memory cells and two select gate transistors connected respectively to both ends of the series circuit of the memory cells.

FIG. 9 shows an example of a structure comprising the memory cell array 11 (shown in detail) of the NAND type EEPROM and the word line potential control circuit (shown by a block) 12-1, 12-2, . . . , of the row decoder (excluding the decode circuit). FIG. 10 shows in detail the word line potential control circuit 12-1, 12-2, . . . , shown in FIG. 9.

The memory cell array 11 comprises a plurality of NAND cell units each including four series-connected memory cells and select gate transistors connected to both ends of the series-circuit of the memory cells. In each cell unit, a select gate transistor is connected to one end of the series circuit on the bitline BLi (i=1 to 4223) side, and similarly another select gate transistor is connected to the other end of the series circuit on the source line (source terminal VS) side.

One block is constituted by 4224 NAND cell units arranged in the row direction (i.e. the direction of extension of word lines). A page is a unit of memory cells permitting simultaneous read/write.

The number of memory cells of each NAND cell unit is not limited to four, and may be eight, 16, etc. In addition, the number of NAND cell units (bitlines) arranged in the row direction is not limited to 4224, and may be, e.g. 2112.

The word line potential control circuits 12-1, 12-2, . . . , are provided for the respective blocks, as shown in FIG. 9. In FIG. 10, signals Pi (i=0 to Np), Qi (I=0 to Nq) and Ri (i=0 to Nr) are block address signals. Only one signal selected from Np+1 signals Pi is set at power supply potential VCC. Only one signal selected from Nq+1 signals Qi is set at power supply potential VCC. Only one signal selected from Nr+1 signals Ri is set at power supply potential VCC. When Np=7, Nq=7 and Nr=15, it is possible to select Np+1×Nq+1×Nr+1=1024 blocks.

In the word line potential control circuit corresponding to the selected block, all signals Pi, Qi and Ri are set at H (High) level. The signal Pi is input to an n-channel MOS transistor Qn25 and a p-channel MOS transistor Qp5. The signal Qi is input to an n-channel MOS transistor Qn26 and a p-channel MOS transistor Qp6. The signal Ri is input to an n-channel MOS transistor Qn27 and a p-channel MOS transistor Qp7. In the selected block in which all signals Pi, Qi and Ri are at “H” level, an input signal to an inverter I2 is set at “L” level.

In the word line potential control circuit corresponding to the block having a defective memory cell, a fuse F1 is cut off in order to prevent selection of this block. If the fuse F1 is cut off, the input signal level of the inverter I2 is kept at “H” even if all signals Pi, Qi and Ri are at “H”. The reason is that the input terminal potential of the inverter I2 is fixed at “H” by the inverter I2 and a p-channel MOS transistor Qp8.

In the word line potential control circuit corresponding to the selected block, an output signal of the inverter I2 is at “H”. The output signal of the inverter I2 is delivered to the gates of n-channel MOS transistors (transfer gates) Qn28 to Qn31 via a depletion type n-channel MOS transistor Qnd1.

Thus, a signal GSGD passes through the MOS transistor Qn28 and becomes a signal SGDm. The signal SGDm is applied to the gate of the drain-side (bitline-side) select gate transistor of the selected block. A signal GSGS passes through the MOS transistor Qn31 and becomes a signal SGSm. The signal SGSm is applied to the gate of the source-side select gate transistor of the selected block.

Similarly, signals GWL0 to GWL3 obtained by decoding low address signals pass through MOS transistors Qn29 to Qn30 and become signals WL0m to WL3m. The signals WL0m to WL3m are applied to the gates of the memory cells of each NAND cell of the selected block.

The potentials of the signals GSGD, GSGS and WL0m to WL3m are set at predetermined values in accordance with the respective modes of erase, write and read.

N-channel MOS transistors Qn22 to Qn24, capacitors C1 and C2, an inverter I1 and a NAND logic circuit G1 constitute a circuit for transferring a potential VPPRW, which is higher than power supply potential VCC, to the gates of the n-channel MOS transistors Qn28 to Qn31 of the selected block.

In the word line potential control circuit corresponding to the selected block, a signal Rm is at “H” level. Thus, a high-voltage switch comprising the transistors Qn22 to Qn24, capacitor C1 and NAND logic circuit G1 is positive-feedback-operated by the clock signal OSC, and the gate potentials of MOS transistors Qn28 to Qn31 increase.

In the word line potential control circuit corresponding to a non-selected block, the signal Rm is at “L” level. Thus, if a signal WLGNDB is at “L” level, an output signal of a NOR logic circuit G2 becomes at “H” level and n-channel MOS transistors Qn32 to Qn34 are rendered conductive. As a result, the signals SGDm and signals WL0m to WL3m are set at “L” level (ground potential).

When the voltage VPPRW is to be transferred to the MOS transistors Qn28 to Qn31, the signal BWLHB is set at 0V. The reason is that the depletion type n-channel MOS transistor Qnd1 is able to transmit the power supply potential VCC from its drain to source when its gate is set at power supply potential VCC and is unable to transmit the potential VCC from its drain to source when its gate is at 0V.

The operations of the erase, write and read modes of the NAND type EEPROM are described, for example, in IEEE Journal of Slid-State Circuits, Vol. 30, No. 11, pp. 1157–64, Nov. 1995.

The write-mode operation of the NAND type EEPROM, in particular, will now be described.

FIG. 11 shows operational waveforms in the write mode.

Date write is successively effected in plural memory cells constituting the NAND cell unit, from the source-line-side memory cell M3 to the bitline-side memory cell M0. An increased write voltage VPP (=about 20V) is applied to the control gate of the selected memory cell, and an intermediate potential VM10 (=about 10V) is applied to the control gate of the non-selected memory cell. An intermediate potential, e.g. power supply potential VCC, is applied to the gate of the bitline-side select gate transistor S1. The gate of the source-line-side select gate transistor S2 is set at 0V. A zero voltage ("0" write) or an intermediate potential ("1" write) is applied to the bitline in accordance with data.

At this time, the bitline potential is transmitted to the selected memory cell. At the time of "0" write, a high voltage is applied between the floating gate of the selected memory cell and the substrate and electrons are tunnel-injected from the substrate into the floating gate. Thus, a threshold voltage of the selected memory cell is shifted to the positive side. At the time of "1" write, electrons do not move and the threshold voltage of the selected memory cell does not change.

FIG. 12 shows power supply lines for supplying power supply potentials VCC and VSS to the word line potential control circuits 12-1, 12-2, . . . , of the row decoder 12. FIG. 13 shows operational waveforms in a batch-write test mode.

The cycle T of the clock signal OSC is generally set in a range of from several-ten nsec to one-hundred several-ten nsec. Since the signal Rm (FIG. 10) in the word line potential control circuit corresponding to the non-selected block is at "L" level, the clock signal OSC does not drive the capacitor C1 (FIG. 10). Thus, 0V is applied to the gates of MOS transistors (transfer gates) Qn28 to Qn31 shown in FIG. 10.

In the batch-write test mode, data write is effected in all memory cells at a time. At this time, in all word line potential control circuits, the signal Rm is set at "H" level and the clock signal OSC drives the capacitor C1. The increased potential VPPRW is applied to the gates of the MOS transistors (transfer gates) Qn28 to Qn31 shown in FIG. 10.

In addition, an increased write voltage VPP (=about 20V) is applied to the control gates of all memory cells. An intermediate potential, e.g. a power supply potential VCC, is applied to the gate of the bitline-side select gate transistor, and 0V is applied to the gate of the source-line-side select gate transistor. Besides, 0V ("0" write) is applied to the bitline.

At this time, parasitic resistance R occurs in the power supply lines for supplying power supply potentials VCC and VSS from power supply pads 18 and 19 to the word line potential control circuits 12-1, . . . ,12-n. Consequently, power supply potentials VCC11, . . . ,VCC1n supplied to the word line potential control circuits 12-1, . . . ,12-n are lower than the power supply potential VCC applied to the power supply pad 18. Similarly, power supply potentials VSS11, . . . ,VSS1n are lower than the power supply potential VSS applied to the power supply pad 19.

Accordingly, the capacitors of the word line potential control circuits 12-1, . . . ,12-n are driven at an amplitude between the power supply potential VCCi (i=1 to n) and power supply potential VSSi. This amplitude is less than the normal amplitude (VCC-VSS).

Consequently, the gate potentials of the MOS transistors (transfer gates) Qn28 to Qn31 become lower than the increased potential VPPRW which is to be normally applied. A potential VQQ, which is lower than the predetermined write potential VPP, is applied to all word lines, and a satisfactory batch-write test cannot be performed.

BRIEF SUMMARY OF THE INVENTION

The present invention has been made in consideration of the above drawbacks and its object is to provide a semiconductor memory capable of supplying a sufficient write potential VPP to all word lines even in a batch-write test mode.

In order to achieve the object, there is provided a semiconductor memory according to a first aspect of the present invention, which comprises:

a memory cell array having a plurality of electrically programmable memory cells arranged in a matrix;

a row decoder for supplying a predetermined potential to word lines of the memory cells in accordance with an operation mode;

a clock generating circuit for generating a clock signal for driving the row decoder; and a command register for recognizing the operation mode and delivering a recognition result to the clock generating circuit, wherein there are provided a first mode in which the clock generating circuit generates the clock signal at a first cycle and a second mode in which the clock generating circuit generates the clock signal at a second cycle longer than the first cycle.

In the semiconductor memory according to the first aspect of the present invention, the memory cell array may comprise NAND cell units arranged in a matrix, each NAND cell unit comprising a plurality of series-connected memory cells and select gate transistors connected to both ends of the series-connected memory cells.

In the semiconductor memory according to the first aspect of the present invention, the row decoder may include transfer gates, connected to the respective word lines, for transferring the predetermined potential to the word lines, and a boosted voltage applying circuit for applying a boosted voltage to gates of the transfer gates on the basis of the clock signal.

In the semiconductor memory according to the first aspect of the present invention, the memory cell array may include a plurality of blocks, the row decoder may include word line potential control circuits provided for the respective blocks, and the plurality of word line potential control circuits may be driven in the second mode.

In the semiconductor memory according to the first aspect of the present invention, the second mode may be a batch-write test mode in which identical data is written in all the memory cells.

In the semiconductor memory according to the first aspect of the present invention, the memory cell array may include a plurality of blocks, the row decoder may include word line potential control circuits provided for the respective blocks, and the word line potential control circuit provided for the respective blocks may be driven in a mode in which the memory cells contained in a corresponding block are selected.

In the semiconductor memory according to the first aspect of the present invention, the clock generating circuit may have an oscillator and a capacitance for determining the cycle of the clock signal, and the capacitance may be greater in the second mode than in the first mode.

In the semiconductor memory according to the first aspect of the present invention, the clock generating circuit may have an oscillator, a capacitor for determining the cycle of the clock signal and a switch for connecting the capacitor to the oscillator in the second mode.

In the semiconductor memory according to the first aspect of the present invention, the clock generating circuit may have an oscillator, a first capacitor and a second capacitor for determining the cycle of the clock signal and a switch for connecting the first capacitor to the second capacitor in parallel, and the capacitance of the capacitor may be greater in the second mode than in the first mode, by connecting the first capacitor to the second capacitor in parallel using the switch.

In the semiconductor memory according to the first aspect of the present invention, the clock generating circuit may have first and second resistors for determining the cycle of the clock signal, the first resistor may be used in the second mode, the second resistor may be used in the first mode, and the first resistor may have a higher resistance value than the second resistor.

There is also provided a semiconductor memory according to a second aspect of the present invention, which comprises:

a memory cell array having a plurality of electrically programmable memory cells arranged in a matrix;

a row decoder for supplying a predetermined potential to word lines of the memory cells in accordance with an operation mode;

a clock generating circuit for generating a clock signal for driving the row decoder; and a command register for recognizing the operation mode and delivering a recognition result to the clock generating circuit, wherein the clock generating circuit generates the clock signal having a cycle longer than a cycle in a normal operation mode, when the operation mode is a mode in which all the memory cells are selected in a batch.

In the semiconductor memory according to the second aspect of the present invention, the memory cell array may comprise NAND cell units arranged in a matrix, each NAND cell unit comprising a plurality of series-connected memory cells and select gate transistors connected to both ends of the series-connected memory cells.

In the semiconductor memory according to the second aspect of the present invention, the row decoder may include transfer gates, connected to the respective word lines, for transferring the predetermined potential to the word lines, and a boosted voltage applying circuit for applying a boosted voltage to gates of the transfer gates on the basis of the clock signal.

In the semiconductor memory according to the second aspect of the present invention, the memory cell array may include a plurality of blocks, the row decoder may include word line potential control circuits provided for the respective blocks, and all the word line potential control circuit provided for the respective blocks may be driven in the mode in which all the memory cells are selected in a batch.

In the semiconductor memory according to the second aspect of the present invention, the mode in which all the memory cells are selected in a batch may be a batch-write test mode in which identical data is written in all the memory cells.

In the semiconductor memory according to the second aspect of the present invention, the memory cell array may include a plurality of blocks, the row decoder includes word line potential control circuits provided for the respective blocks, and the word line potential control circuit provided for the respective blocks may be driven in a mode in which the memory cells contained in a corresponding block are selected.

In the semiconductor memory according to the second aspect of the present invention, the clock generating circuit may have an oscillator and a capacitance for determining the cycle of the clock signal, and the capacitance may be greater in the mode in which all the memory cells are selected in a batch than in the normal operation mode.

In the semiconductor memory according to the second aspect of the present invention, the clock generating circuit may have an oscillator, a capacitor for determining the cycle of the clock signal and a switch for connecting the capacitor to the oscillator in the mode in which all the memory cells are selected in a batch.

In the semiconductor memory according to the second aspect of the present invention, the clock generating circuit may have an oscillator, a first capacitor and a second capacitor for determining the cycle of the clock signal and a switch for connecting the first capacitor to the second capacitor in parallel, and the capacitance of the capacitor may be greater in the mode in which all the memory cells are selected in a batch than in the normal operation mode, by connecting the first capacitor to the second capacitor in parallel using the switch.

In the semiconductor memory according to the second aspect of the present invention, the clock generating circuit may have first and second resistors for determining the cycle of the clock signal, the first resistor may be used in the mode in which all the memory cells are selected in a batch, the second resistor may be used in the normal operation mode, and the first resistor may have a higher resistance value than the second resistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A semiconductor memory according to the present invention will now be described in detail with reference to the accompanying drawings.

Figure 1:
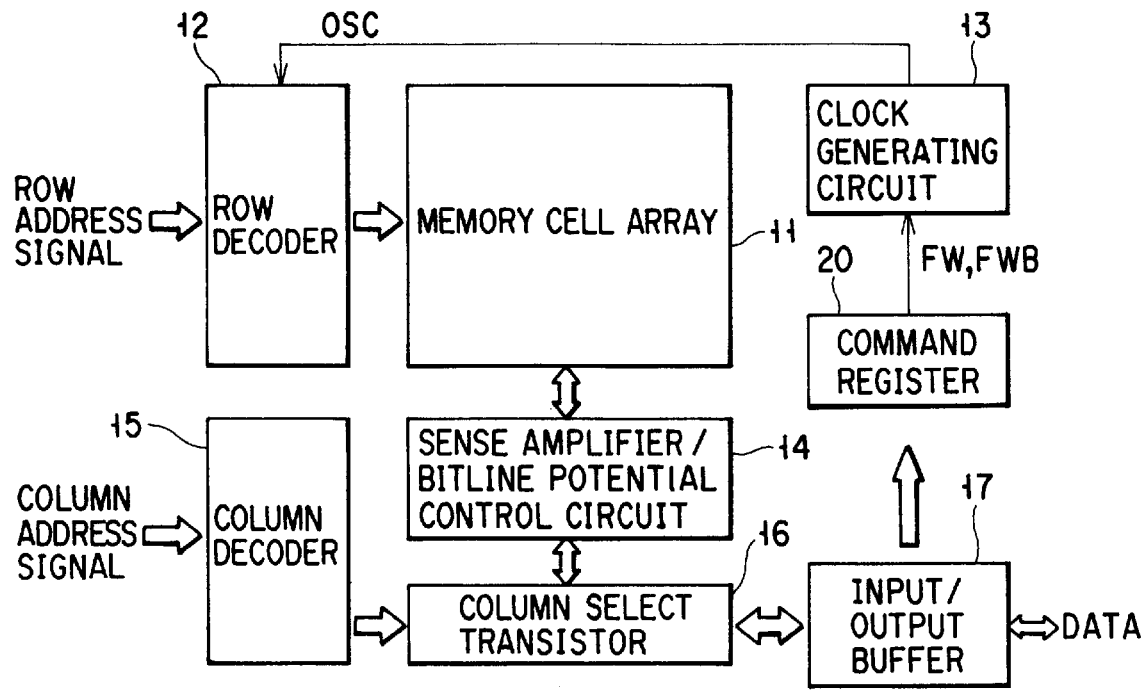
FIG. 1 is a block diagram of a non-volatile semiconductor memory according to an embodiment of the invention.

FIG. 1 shows the structure of a non-volatile semiconductor memory according to the embodiment of the invention.

Figure 9:
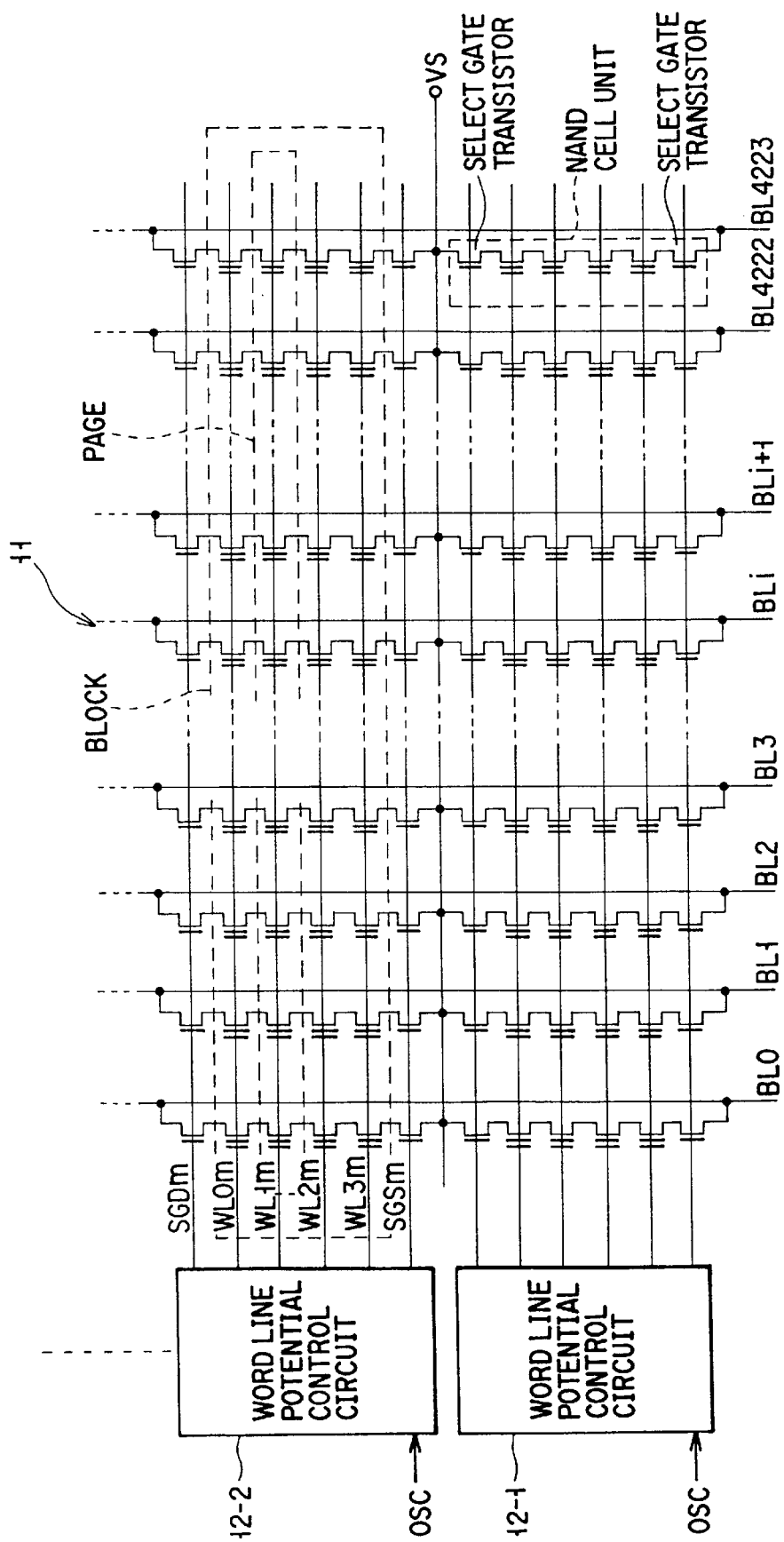
FIG. 9 shows a cell array and a row decoder of the non-volatile semiconductor memories shown in FIGS. 1 and 8.

A memory cell array 11 of the non-volatile semiconductor memory comprises a plurality of electrically programmable memory cells arranged in a matrix. Although not shown, the memory cell array 11 is a memory cell array of a NAND type EEPROM, and in this example the memory cell array 11 has a structure the same as the structure shown in FIG. 9.

The memory cell array 11 comprises a plurality of NAND cell units each including four series-connected memory cells and select gate transistors connected to both ends of the series-circuit of the memory cells. In each cell unit, a select gate transistor is connected to one end of the series circuit on the bit line BLi (i=1 to 4223) side, and similarly another select gate transistor is connected to the other end of the series circuit on the source line (source terminal VS) side.

One block is constituted by 4224 NAND cell units arranged in the row direction (i.e. the direction of extension of word lines). A page is a unit of memory cells permitting simultaneous read/write.

The number of memory cells of each NAND cell unit is not limited to four, and may be eight, 16, etc. In addition, the number of NAND cell units (bit lines) arranged in the row direction is not limited to 4224, and may be, e.g. 2112.

Figure 10:
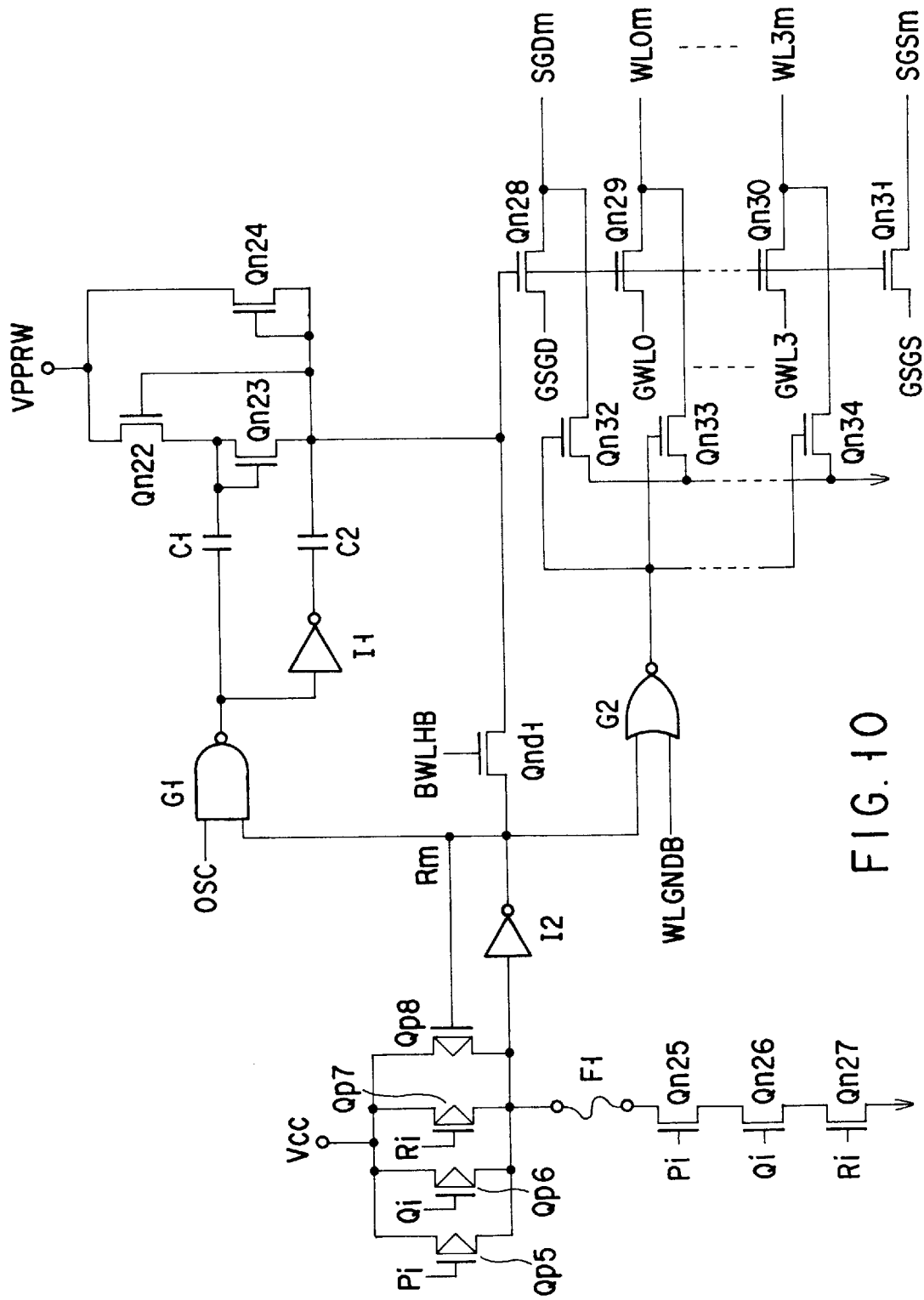
FIG. 10 shows an example of a detailed structure of a word line potential control circuit shown in FIG. 9.

A row decoder 12 comprises a decode circuit for decoding row address signals and a word line potential control circuit for determining word line potentials. The decode circuit selects, on the basis of row address signals, a word line and memory cells connected to the selected word line for which erase, write or read is executed and supplies a predetermined potential to the control gates of the memory cells. The decode circuit may be a known decode circuit. The word line potential control circuit may be the same as the word line potential control circuit as shown in FIG. 10. The control circuit is provided for each memory cell array block, as shown in FIG. 10. That is, word line potential control circuits 12-1, 12-2, . . . are connected for a plurality of memory cell array blocks, as shown in FIG. 10.

When Np=7, Nq=7 and Nr=15, it is possible to select Np×Nq×Nr=1024 blocks, in which signals Pi (i=0 to Np), Qi (I=0 Nq) and Ri (i=0 to Nr) are block address signals.

The operation of the word line potential control circuits 12-1, 12-2, . . . has been described with reference to FIG. 10.

A clock generating circuit 13 generates a clock signal OSC for driving the row decoder 12. A sense amplifier/ bitline potential control circuit 14, for example, senses data or controls bitline potentials in respective modes of erase, write and read-out.

A column decoder 15 turns on a column select transistor 16 existing on a predetermined select column on the basis of a column address signal, and leads data of the predetermined select column to an input/output buffer 17 or leads data from the input/output buffer 17 to the predetermined select column.

A command register 20 discriminates an erase, write, read or test mode on the basis of command data input to the inside of the chip from the outside of the chip via the input/output buffer 17. The command register 20 delivers a discrimination result to each circuit.

In the present embodiment, when the command register 20 has recognized a batch-write test mode command, it outputs to the clock generating circuit 13 a signal indicating that this command has been recognized.

On the basis of the output signal from the command register 20, the clock generating circuit 13 varies the cycle of the clock signal OSC to be supplied to the row decoder 12. Specifically, a cycle T2 of the clock signal generated in the batch-write test mode is made greater than a cycle T1 of the clock signal generated in the normal operation (erase, write, read) mode.

In general, the cycle T1 of clock signal OSC in the normal operation mode is several-ten nsec to one-hundred several-ten nsec (e.g. 100 nsec). Thus, the cycle T2 of the clock signal OSC in the batch-write test mode is set to be more than double the cycle in the normal operation mode (e.g. about 500 nsec).

According to the above structure, since the cycle of the clock signal OSC in the batch-write test mode is set to be longer than that of the clock signal OSC in the normal operation mode, power supply potentials VCCi and VSSi applied to each word line potential control circuit of the row decoder can be substantially equalized to the power supply potentials VCC and VSS applied to the power supply pads in the batch-write test mode. Sufficient write potential VPP can be supplied to all word lines.

Figure 2:
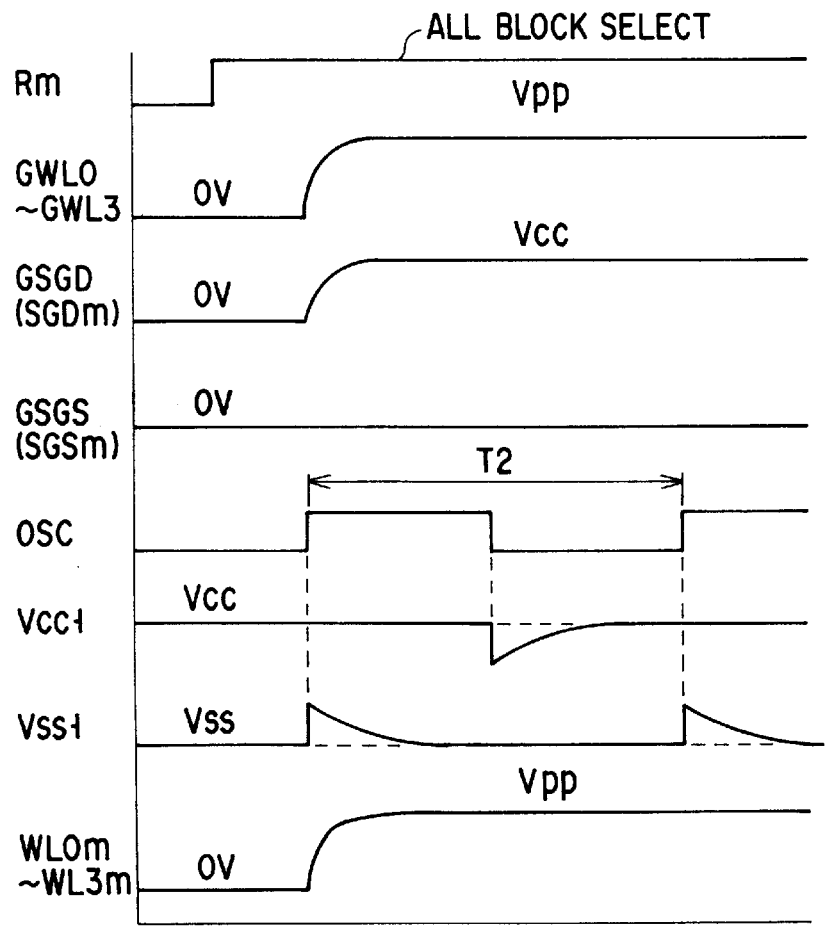
FIG. 2 shows operational waveforms in a batch-write test mode of the memory shown in FIG. 1.

FIG. 2 shows operational waveforms in the batch-write test mode. Suppose that the word line potential control circuit has the structure shown in FIG. 10.

The cycle T of clock signal OSC is set to be a value corresponding to an integer number of times of the cycle in the normal operation mode, i.e. a time period (e.g. about 500 nsec) in which the power supply potential VCCi, VSSi can be sufficiently increased/decreased to the power supply potential VCC, VSS even if the increase/decrease of power supply potential VCCi, VSSi becomes gentle due to parasitic resistance of the power supply line.

In the batch-write test mode, data is written simultaneously in all memory cells. At this time, in all word line potential control circuits, the signal Rm is at "H" level. The clock signal OSC drives the capacitor Cl and the increased potential VPPRW is applied to the gates of MOS transistors (transfer gates) Qn28 to Qn31 shown in FIG. 10.

In addition, a boosted write voltage VPP (=about 20V) is applied to control gates of all memory cells, an intermediate potential, e.g. power supply voltage VCC, is applied to the gate of the bitline-side select gate transistor, and the gate of the source-line-side select gate transistor is set at 0V. The bitlines are supplied with 0V ("0" write).

Figure 12:
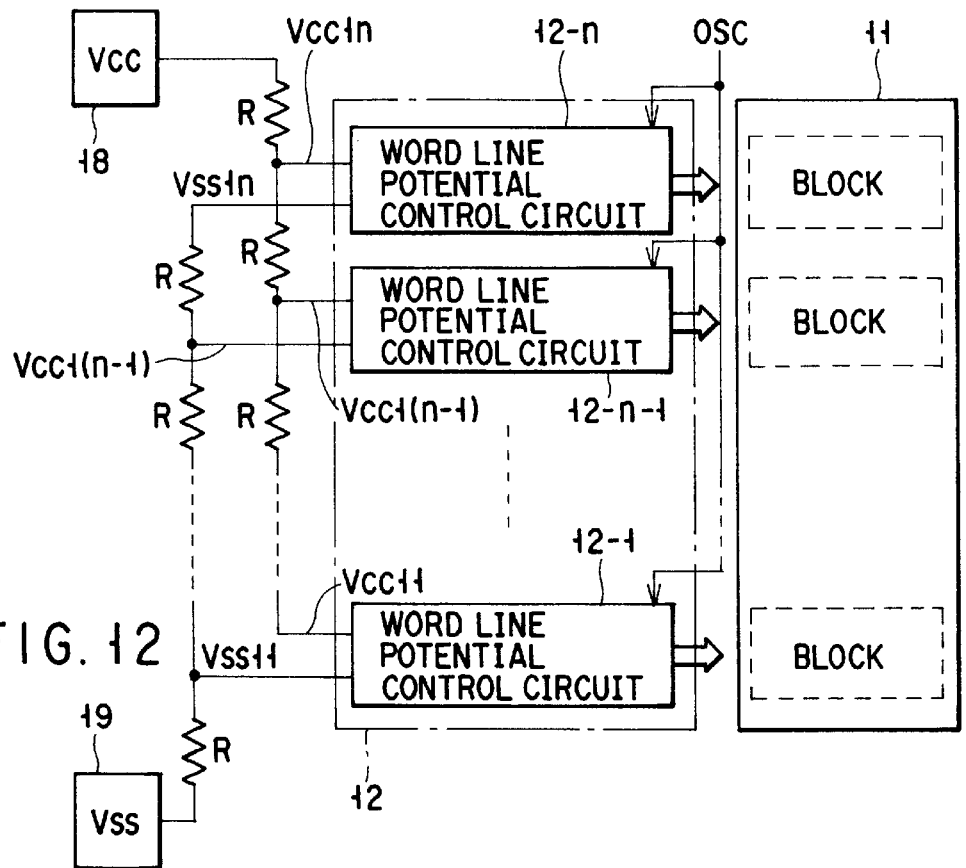
FIG. 12 shows power supply lines for supplying power to the row decoder.
Figure 13:
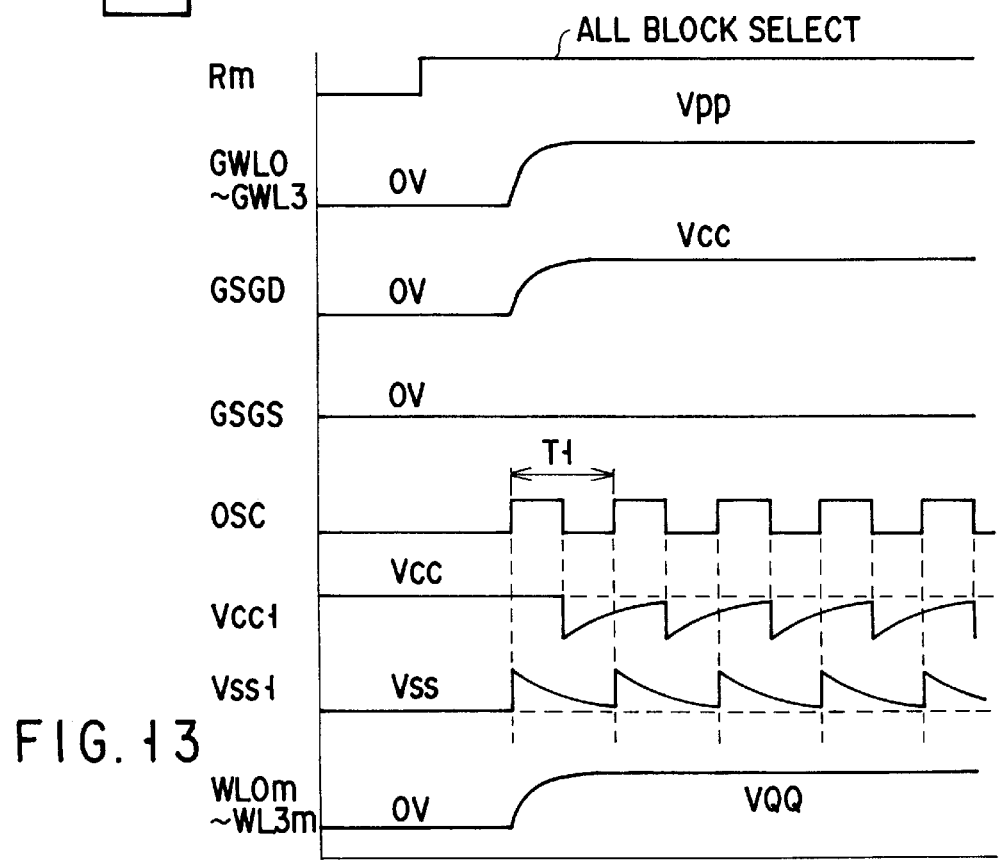
FIG. 13 shows operational waveforms in a batch-write test mode of the conventional non-volatile semiconductor memory shown in FIG. 8.

At this time, as shown in FIG. 12, parasitic resistance R occurs in the power supply lines for supplying power supply potentials VCC and VSS from power supply pads 18 and 19 to the word line potential control circuits 12-1, . . . ,12-n. However, since the cycle T2 of clock OSC is sufficiently long, the power supply potentials VCC11, . . . ,VCC1n supplied to the word line potential control circuits 12-1, . . . ,12-n become equal to the power supply potential VCC applied to the power supply pad 18.

Thus, the capacitors of the word line potential control circuits 12-1, . . . ,12-n are driven at an amplitude between the power supply potential VCC and power supply potential VSS. Accordingly, the gate potentials of the MOS transistors (transfer gates) Qn28 to Qn31 become equal to the normal boosted potential VPPRW. Therefore, the predetermined write potential VPP is applied to all word lines, and a satisfactory batch-write test cannot be performed.

The clock generating circuit according to the embodiment of the invention will now be described.

Figure 3:
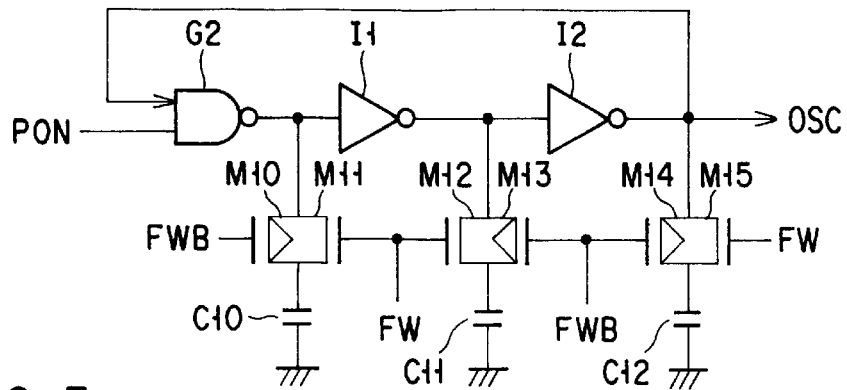
FIG. 3 shows a first example of a detailed structure of a clock generating circuit.

FIG. 3 shows a first example of the clock generating circuit (oscillating circuit) of the invention.

An activation signal PON rises to "H" level, the clock generating circuit starts to operate. Signals FW and FWB are supplied from the command register. In the normal operation (write) mode, the signal FW is at "L" level and the signal FWB is at "H" level. Thus, all MOS transistors (transfer gates) M10 to M15 are rendered non-conductive, and capacitors C10, C11 and C12 are not connected to output nodes of the NAND logic circuit G2 and inverters I1 and I2, respectively.

Accordingly, in the normal operation (write) mode, the clock generating circuit generates a clock signal OSC of a relatively short cycle.

On the other hand, in the batch-write test mode, the signal FW is at "H" level and signal FWB is at "L". Thus, all MOS transistors M10 to M15 are rendered conductive, and capacitors C10, C11 and C12 are connected to output nodes of the NAND logic circuit G2 and inverters I1 and I2, respectively.

Accordingly, in the batch-write test mode, the clock generating circuit generates a clock signal OSC of a cycle longer than the cycle in the normal operation mode.

Since the clock signals OSC having different cycles in the respective modes are used, the normal operation mode and test mode can be effected quickly and exactly.

Figure 4:
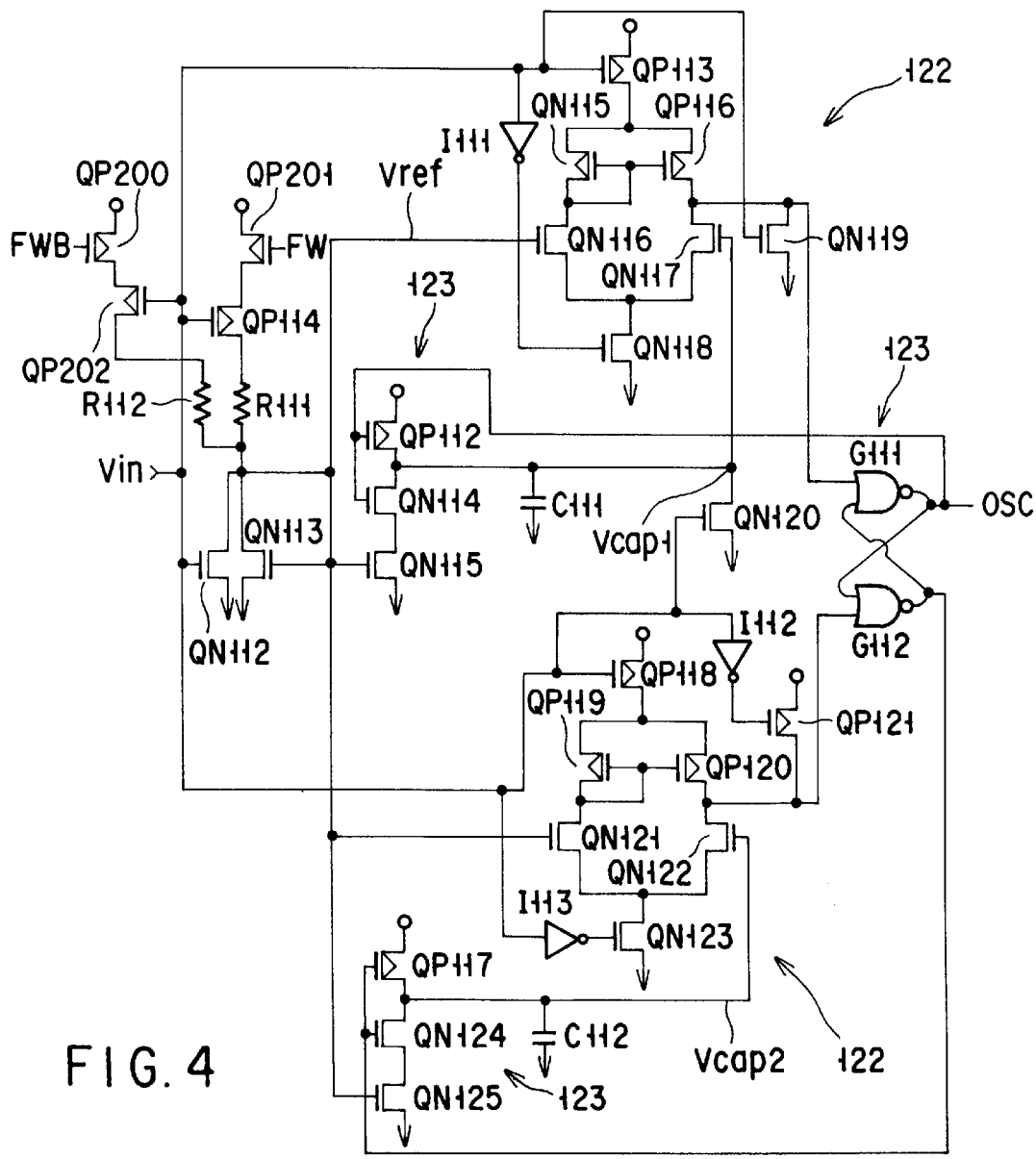
FIG. 4 shows a second example of a detailed structure of the clock generating circuit.
Figure 6:
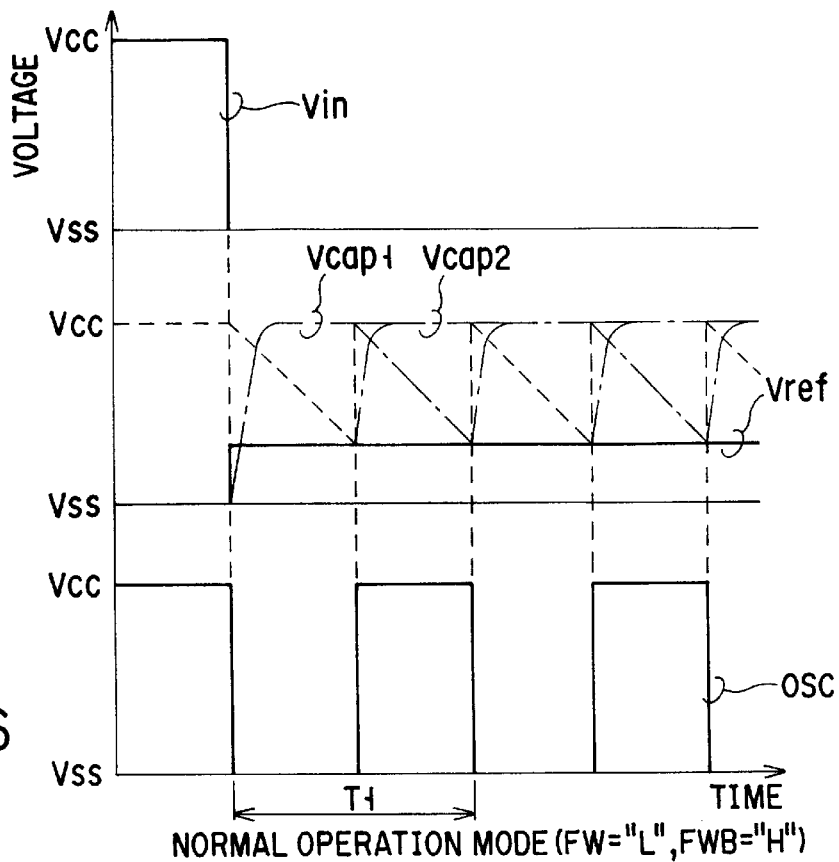
FIG. 6 shows operational waveforms in a normal operation mode of the clock generating circuits shown in FIGS. 4 and 5.
Figure 7:
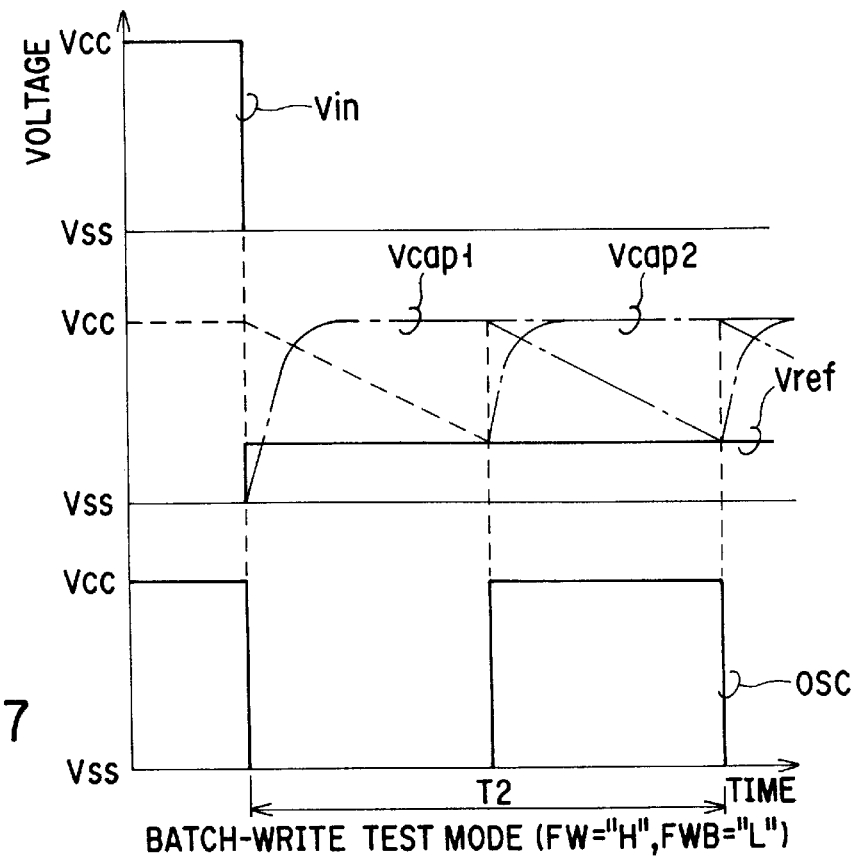
FIG. 7 shows operational waveforms in a batch-write test mode of the clock generating circuits shown in FIGS. 4 and 5.
Figure 8:
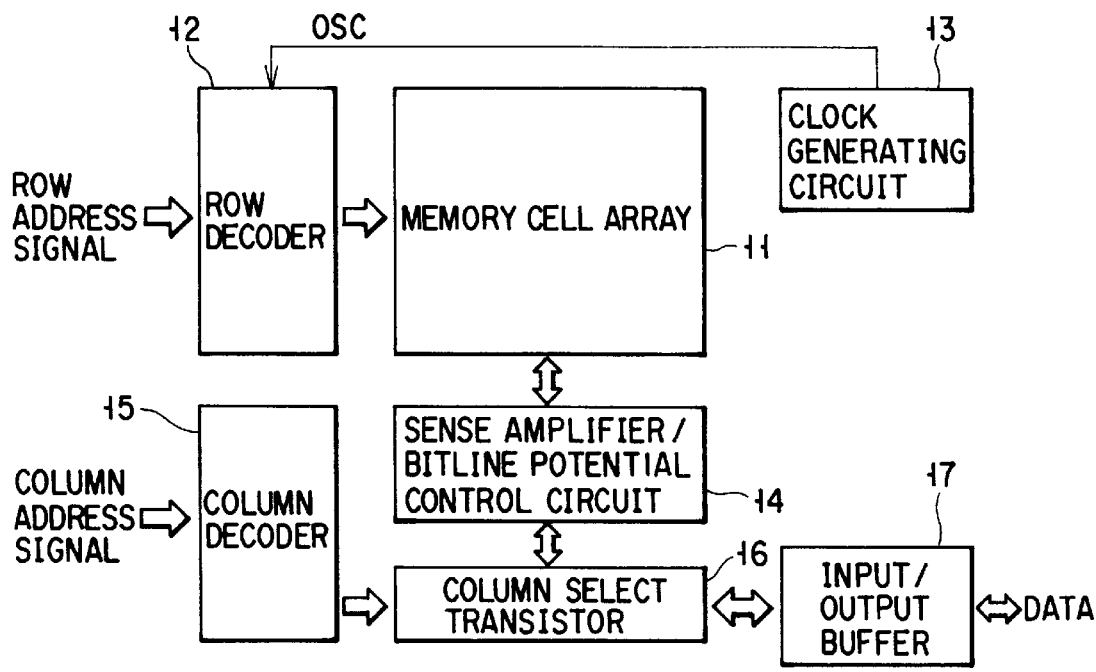
FIG. 8 shows a conventional non-volatile semiconductor memory.
Figure 11:
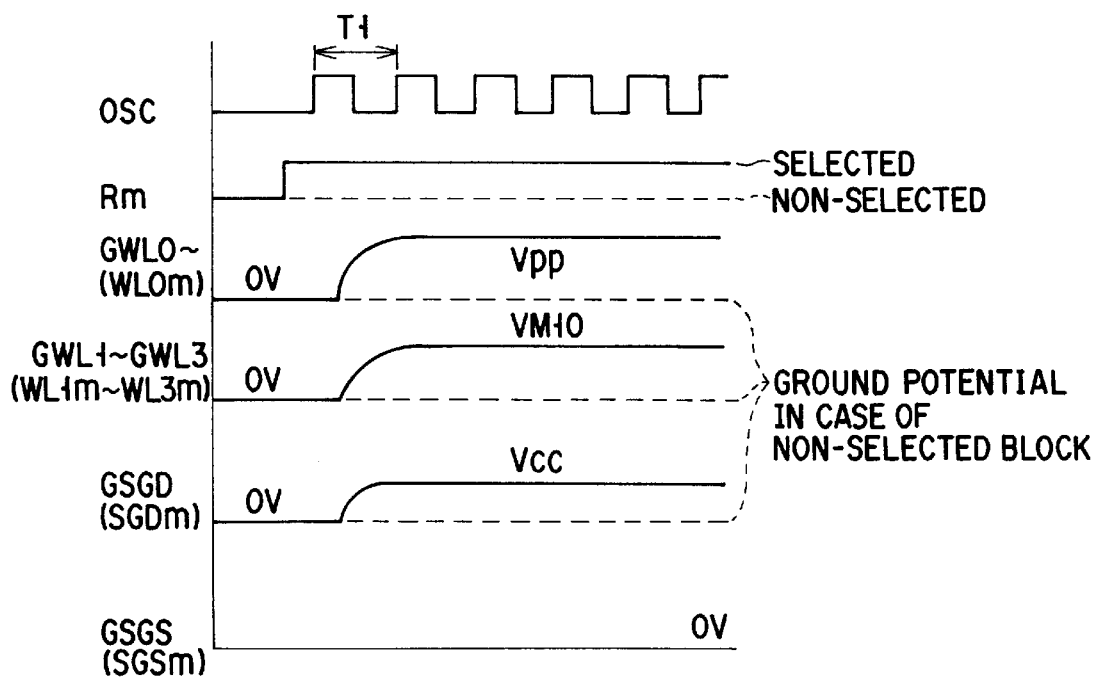
FIG. 11 shows operational waveforms in a normal write mode of the conventional non-volatile semiconductor memory shown in FIG. 8.

FIG. 4 shows a second example of the clock generating circuit (oscillating circuit) of the invention. FIG. 6 shows operational waveforms in the normal operation mode and FIG. 7 shows operational waveforms in the batch-write test mode.

This clock generating circuit is an improvement of the oscillating circuit described in the prior-art document (Jpn. Pat. Appln. KOKAI Publication No. 8-65111). Compared to the oscillating circuit of this document, the clock generating circuit of this embodiment is additionally provided with p-channel MOS transistors QP200, QP201 and QP202 and a resistor R112.

A signal FWB is input to the gate of the MOS transistor QP200 and a signal FW is input to the gate of the MOS transistor QP201. In the normal write mode, the signal FW is at "L" level and the signal FWB is at "H" level. An electric current thus flows through the resistor R111. On the other hand, in the batch-write test mode, the signal FW is at "H" level and the signal FWB is at "L" level, and thus a current flows through the resistor R112.

If the resistance value of the resistor R112 is set to be greater than that of the resistor R111, the cycle of the clock signal OSC generated in the batch-write test mode becomes longer than the cycle of the clock signal OSC generated in the normal write mode.

As described above, since the clock generating circuit of this example generates the clock signal OSC in the batch-write test mode, whose cycle is longer than the cycle in the normal operation mode, the row decoder (word line potential control circuit) can apply the potential VPP to all word lines.

Figure 5:
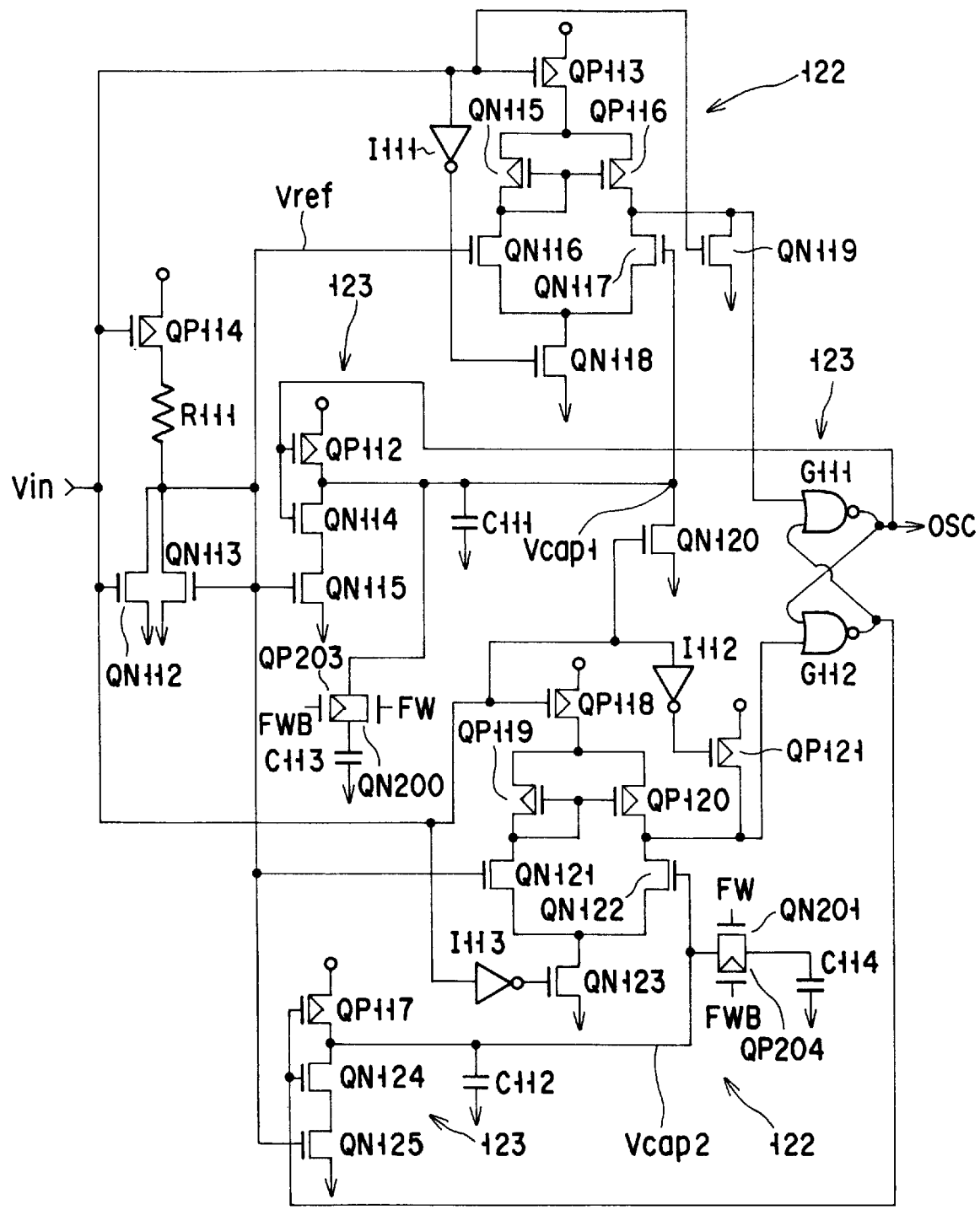
FIG. 5 shows a third example of a detailed structure of the clock generating circuit.

FIG. 5 shows a third example of the clock generating circuit (oscillating circuit) of the present invention. FIG. 6 shows operational waveforms in the normal operation mode, and FIG. 7 shows operational waveforms in the batch-write test mode.

This clock generating circuit, too, is an improvement of the oscillating circuit described in the document (Jpn. Pat. Appln. KOKAI Publication No. 8-65111). Compared to the oscillating circuit of this document, the clock generating circuit of this embodiment is additionally provided with p-channel MOS transistors QP203 and QP204, n-channel MOS transistors QN200 and QN201, and capacitors C113 and C114.

The signal FWB is input to the gates of MOS transistors QP203 and QP204, and the signal FW is input to the gates of MOS transistors QN200 and QN201. In the normal write mode, the signal FW is at "L" level and the signal FWB is at "H" level. Thus, the capacitors C113 and C114 are not connected in parallel to the capacitors C111 and C112. In the normal write mode, accordingly, the clock signal OSC of a relatively short cycle is output.

On the other hand, in the batch-write test mode, the signal FW is at "H" level and the signal FWB is at "L" level. Thus, the capacitors C113 and C114 are connected in parallel to the capacitors C111 and C112. In the batch-write test mode, accordingly, the clock signal OSC having a longer cycle than the clock signal generated in the normal write mode is output.

As described above, since the clock generating circuit of this example generates the clock signal OSC in the batch-write test mode, whose cycle is longer than the cycle in the normal operation mode, the row decoder (word line potential control circuit) can apply the potential VPP to all word lines.

The semiconductor memory of this invention, as described above, has the following advantages.

The cycle of the clock signal OSC for controlling the row decoder (word line potential control circuit) differs between the normal operation (write) mode and the batch-write test mode. For example, the output of the command register for recognizing the mode is supplied to the clock generating circuit. Thereby, the clock generating circuit generates the clock signal in the batch-write test mode, whose cycle is longer than the cycle in the normal operation mode.

Accordingly, even if all word line potential control circuits provided for respective blocks are driven in the batch-write test mode, each word line potential control circuit can supply the write potential VPP to all selected word lines. In other words, the batch-write test can be performed exactly.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor memory comprises:
   a memory cell array having a plurality of electrically programmable memory cells arranged in a matrix;
   a row decoder for supplying a predetermined potential to word lines of the memory cells in accordance with an operation mode;
   a clock generating circuit for generating a clock signal for driving the row decoder; and
   a command register for recognizing the operation mode and delivering a recognition result to the clock generating circuit,
   wherein there are provided a first mode in which the clock generating circuit generates the clock signal at a first cycle and a second mode in which the clock generating circuit generates the clock signal at a second cycle longer than the first cycle.

2. The semiconductor memory according to claim 1, wherein the memory cell array comprises NAND cell units arranged in a matrix, each NAND cell unit comprising a plurality of series-connected memory cells and select gate transistors connected to both ends of the series-connected memory cells.

3. The semiconductor memory according to claim 1, wherein the row decoder includes transfer gates, connected to the respective word lines, for transferring the predetermined potential to the word lines, and a boosted voltage applying circuit for applying a boosted voltage to gates of the transfer gates on the basis of the clock signal.

4. The semiconductor memory according to claim 1, wherein the memory cell array includes a plurality of blocks, the row decoder includes word line potential control circuits provided for the respective blocks, and the plurality of word line potential control circuits are driven in the second mode.

5. The semiconductor memory according to claim 4, wherein the second mode is a batch-write test mode in which identical data is written in all the memory cells.

6. The semiconductor memory according to claim 1, wherein the memory cell array includes a plurality of blocks, the row decoder includes word line potential control circuits provided for the respective blocks, and the word line potential control circuit provided for the respective blocks is driven in a mode in which the memory cells contained in a corresponding block are selected.

7. The semiconductor memory according to claim 1, wherein the clock generating circuit has an oscillator and a capacitance for determining the cycle of the clock signal, and the capacitance is greater in the second mode than in the first mode.

8. The semiconductor memory according to claim 1, wherein the clock generating circuit has an oscillator, a capacitor for determining the cycle of the clock signal and a switch for connecting the capacitor to the oscillator in the second mode.

9. The semiconductor memory according to claim 1, wherein the clock generating circuit has an oscillator, a first capacitor and a second capacitor for determining the cycle of the clock signal and a switch for connecting the first capacitor to the second capacitor in parallel, and the capacitance of the capacitor is greater in the second mode than in the first mode, by connecting the first capacitor to the second capacitor in parallel using the switch.

10. The semiconductor memory according to claim 1, wherein the clock generating circuit has first and second resistors for determining the cycle of the clock signal, the first resistor is used in the second mode, the second resistor is used in the first mode, and the first resistor has a higher resistance value than the second resistor.

11. A semiconductor memory comprises:
a memory cell array having a plurality of electrically programmable memory cells arranged in a matrix;
a row decoder for supplying a predetermined potential to word lines of the memory cells in accordance with an operation mode;
a clock generating circuit for generating a clock signal for driving the row decoder; and
a command register for recognizing the operation mode and delivering a recognition result to the clock generating circuit,
wherein the clock generating circuit generates the clock signal having a cycle longer than a cycle in a normal operation mode, when the operation mode is a mode in which all the memory cells are selected in a batch.

12. The semiconductor memory according to claim 11, wherein the memory cell array comprises NAND cell units arranged in a matrix, each NAND cell unit comprising a plurality of series-connected memory cells and select gate transistors connected to both ends of the series-connected memory cells.

13. The semiconductor memory according to claim 11, wherein the row decoder includes transfer gates, connected to the respective word lines, for transferring the predetermined potential to the word lines, and a boosted voltage applying circuit for applying a boosted voltage to gates of the transfer gates on the basis of the clock signal.

14. The semiconductor memory according to claim 11, wherein the memory cell array includes a plurality of blocks, the row decoder includes word line potential control circuits provided for the respective blocks, and all the word line potential control circuit provided for the respective blocks are driven in the mode in which all the memory cells are selected in a batch.

15. The semiconductor memory according to claim 14, wherein the mode in which all the memory cells are selected in a batch is a batch-write test mode in which identical data is written in all the memory cells.

16. The semiconductor memory according to claim 11, wherein the memory cell array includes a plurality of blocks, the row decoder includes word line potential control circuits provided for the respective blocks, and the word line potential control circuit provided for the respective blocks is driven in a mode in which the memory cells contained in a corresponding block are selected.

17. The semiconductor memory according to claim 11, wherein the clock generating circuit has an oscillator and a capacitance for determining the cycle of the clock signal, and the capacitance is greater in the mode in which all the memory cells are selected in a batch than in the normal operation mode.

18. The semiconductor memory according to claim 11, wherein the clock generating circuit has an oscillator, a capacitor for determining the cycle of the clock signal and a switch for connecting the capacitor to the oscillator in the mode in which all the memory cells are selected in a batch.

19. The semiconductor memory according to claim 11, wherein the clock generating circuit has an oscillator, a first capacitor and a second capacitor for determining the cycle of the clock signal and a switch for connecting the first capacitor to the second capacitor in parallel, and the capacitance of the capacitor is greater in the mode in which all the memory cells are selected in a batch than in the normal operation mode, by connecting the first capacitor to the second capacitor in parallel using the switch.

20. The semiconductor memory according to claim 11, wherein the clock generating circuit has first and second resistors for determining the cycle of the clock signal, the first resistor is used in the mode in which all the memory cells are selected in a batch, the second resistor is used in the normal operation mode, and the first resistor has a higher resistance value than the second resistor.

* * * * *

UNITED STATES PATENT AND TRADEMARK OFFICE
CERTIFICATE OF CORRECTION

PATENT NO.: 5,905,691

DATED: May 18, 1999

INVENTOR(S): Toru Tanzawa et al.

It is certified that an error appears in the above-identified patent and that said Letters Patent is hereby corrected as shown below:

On the Title Page, after "Filed: May 26, 1998" please add the following:

-- Foreign Application Priority Data

May 28, 1997   [JP]   Japan . . . . . . . . . . . . . . . . 9-138529--

Signed and Sealed this

Eighth Day of February, 2000

Attest:

Attesting Officer

Q. TODD DICKINSON

Commissioner of Patents and Trademarks